United States Patent
Wang et al.

(10) Patent No.: US 7,720,564 B2
(45) Date of Patent: May 18, 2010

(54) SYSTEMS AND METHODS FOR CROSS-INTRABAY TRANSPORT

(75) Inventors: Kuo-Hua Wang, Kaohsiung (TW); Hsing-Fu Wang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1085 days.

(21) Appl. No.: 11/358,470

(22) Filed: Feb. 21, 2006

(65) Prior Publication Data

US 2007/0198333 A1    Aug. 23, 2007

(51) Int. Cl.
*G06F 7/00* (2006.01)
(52) U.S. Cl. .......................... 700/214; 700/219; 705/13
(58) Field of Classification Search ............... 705/13; 700/219, 228, 214, 213
See application file for complete search history.

(56) References Cited

U.S. PATENT DOCUMENTS

| 7,127,310 | B1 * | 10/2006 | Barto et al. ............. 700/100 |
| 2002/0033319 | A1 * | 3/2002 | Fukushima ............. 198/570 |
| 2003/0190223 | A1 * | 10/2003 | Peiter ..................... 414/542 |
| 2005/0125095 | A1 * | 6/2005 | Chen et al. ............. 700/218 |
| 2007/0016369 | A1 * | 1/2007 | Ishikawa ................ 701/211 |

FOREIGN PATENT DOCUMENTS

| CN | 1603066 | 4/2005 |
| TW | 1243144 | 11/2005 |

OTHER PUBLICATIONS

CN Office Action mailed Jun. 27, 2008.
Chinese language office action.

* cited by examiner

*Primary Examiner*—Gene Crawford
*Assistant Examiner*—Ramya Prakasam
(74) *Attorney, Agent, or Firm*—Thomas, Kayden, Horstemeyer & Risley

(57) ABSTRACT

A transport system. The transport system comprises a first interbay component, a second interbay component, a plurality of intrabay components, and a route controller. The first and second interbay components transport the vehicles between the tool bays. Each of the intrabay components, linked with the second interbay component, transports the vehicles within one of the tool bays. Additionally, the intrabay component does not link with the first interbay component directly. The route controller estimates a transport cost for transporting the vehicle via the second interbay device, and determines whether the vehicle is to be transported via the first or second interbay component according to the estimated transport cost.

3 Claims, 5 Drawing Sheets

SYSTEMS AND METHODS FOR CROSS-INTRABAY TRANSPORT

BACKGROUND

The invention relates generally to a transport system, and particularly to a transport system capable of transporting articles in a fabrication system.

In a conventional fab, wafer processing steps are performed in discrete areas (bays). Wafers are transported between bays (interbay) and within bays (intrabay). FIG. 1 is a schematic view showing a conventional fabrication system layout. A fabrication system 100 capable of fabricating semiconductor wafers comprises tool bays 11 and 15, and a plurality of transport systems. Each tool bay comprises, in general, a number of tools for performing wafer fabrication functions. For example, tool bays 11 and 15 comprise tools 11a to 11h, and tools 15a to 15h, respectively. The transport system uses vehicles for storing and transporting wafers. Within the fabrication system 100, an interbay transport system 19 transfers vehicles between tool bays; and intrabay transport systems 12 and 16 transport vehicles within tool bays 11 and 15, respectively. Wafers cannot be transported between interbay transport systems and intrabay transport systems directly, but are transferred through stockers located at the end of the bays. As shown in FIG. 1, stockers 13 and 17 serve tool bays 11 and 15, respectively. Stocker 13 has interbay load ports 139a, 139b and intrabay load ports 131a, 131b for transporting wafers to and from interbay transport system 19 and intrabay transport system 12, respectively. Stocker 17 has interbay load ports 179a, 179b and intrabay load ports 171a, 171b for transporting wafers to and from interbay transport system 19 and intrabay transport system 16, respectively.

Typically, an intrabay overhead transport (OHT) vehicle delivers wafers directly to the tool. Vehicles loaded with wafers are picked from a process load port by an intrabay OHT vehicle and delivered to the local stocker. A stocker robot then moves the wafers to the interbay interface to be loaded onto an overhead shuttle (OHS) interbay transport system. An OHS vehicle then moves the wafers to the stocker closest to the next process step for storage. When the wafers are to be processed, an available intrabay OHT vehicle goes to the local stocker to retrieve the wafers, transports the wafers inside the bay to the tool location, and "places" the wafers onto the tool loadport. This highly mechanized and segregated transport system requires two stocker transfers to complete the move job, OHT vehicles consigned to their respective intrabay loop, and various control systems for each participating member (intrabay, stocker, interbay).

Recently, OHT devices have been added to the interbay system. In this situation, vehicles are not confined in a particular bay, and the number of vehicles in a particular bay is generally managed manually. Additionally, according to a conventional method, the OHT is used in a tool-to-tool transport, even though it is more efficient using the OHS system. Thus an efficient traffic management cannot be achieved by conventional methods.

SUMMARY

The present invention provides a transport system implementing delivery path management for vehicle transport in an interbay/intrabay transport system. The transport system transports vehicles within a fabrication system, wherein the fabrication system comprises a plurality of tool bays. The transport system comprises a first interbay component, a second interbay component, a plurality of intrabay components, and a route controller. The first and second interbay components transport the vehicles between the tool bays. Each of the intrabay components, linked with the second interbay component, transports the vehicles within one of the tool bays. Additionally, the intrabay component does not link with the first interbay component directly. The route controller estimates a transport cost for transporting the vehicle via the second interbay device, and determines whether the vehicle is transported via the first or second interbay component according to the estimated transport cost.

The present invention also provides a transport system implementing vehicle number balancing for cross-intrabay transport. The transport system transports vehicles within a fabrication system, wherein the fabrication system comprises a first and a second tool bay. The transport system comprises a first intrabay component, a second intrabay component, an interbay component, and a controller. The first intrabay component transports the vehicle within the first tool bay. The second intrabay component transports the vehicle within the second tool bay. The interbay component, linking the first and second intrabay components, transports the vehicle between the tool bays. The controller determines the number of vehicles circulating within the first and second intrabay components according to an estimated transport cost for transporting the vehicle from the first intrabay component to the second intrabay component.

The invention also provides a routing method, used in a transport system comprising first and second interbay components. The transport system transports vehicles within a fabrication system, wherein the fabrication system comprises a first and a second tool bay. A message is received, requesting transport of a vehicle from a first tool bay to a second tool bay. A transport cost pertaining to transporting the vehicle via the second interbay component is estimated. It is then determined whether the estimated transport cost exceeds a preset value, and if not, the second interbay component is assigned to transport the vehicle.

The invention also provides a method for controlling vehicle distribution among first, second, and third intrabay components within a transport system. The transport system transports vehicles within a fabrication system, wherein the fabrication system comprises a first-and second tool bays. It is first determined whether the number of vehicles within the first intrabay component is insufficient based on a preset rule. When the number of vehicles within the first intrabay component is sufficient, costs of transporting vehicles from the second and third intrabay components to the first intrabay component are estimated. The estimated costs corresponding to the second and third intrabay components are compared, and the one with the lower cost is selected to donate one vehicle thereof to the first intrabay component.

DESCRIPTION OF THE DRAWINGS

The invention can be more fully understood by reading the subsequent detailed description and examples with references made to the accompanying drawings, wherein.

DETAILED DESCRIPTION

Exemplary embodiments of the invention will now be described with reference to FIGS. 2 through 4, which generally relate to an automated material handling system. While some embodiments of the invention are applicable to wafer transport in a semiconductor fabrication system, it is understood that other fabrication systems equipped with a hybrid transport system may be implemented.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the Figures corresponds to the Figure number, with the exception that the same reference number is used throughout to refer to an identical component which appears in multiple Figures.

Figure 1:
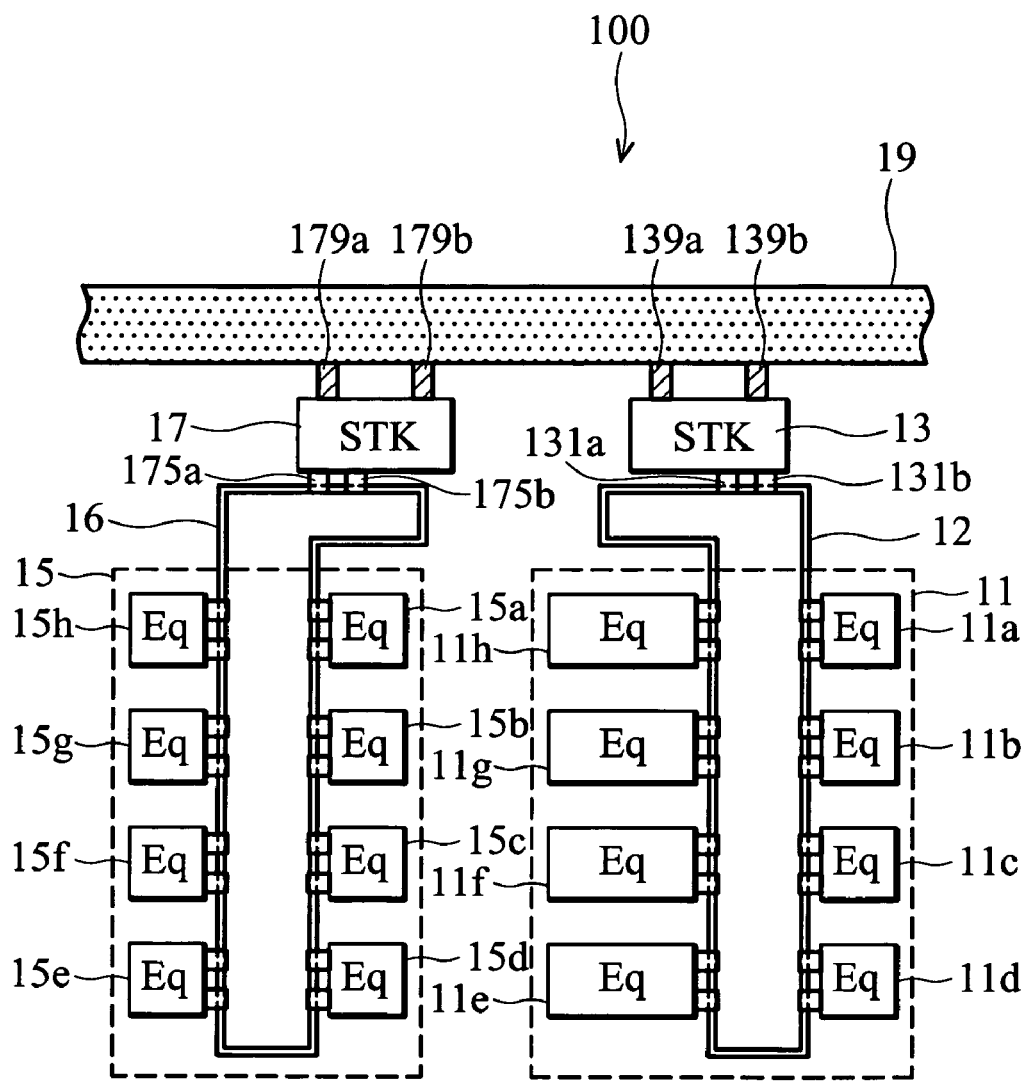
FIG. 1 is a schematic view of a conventional fabrication system.
Figure 2:
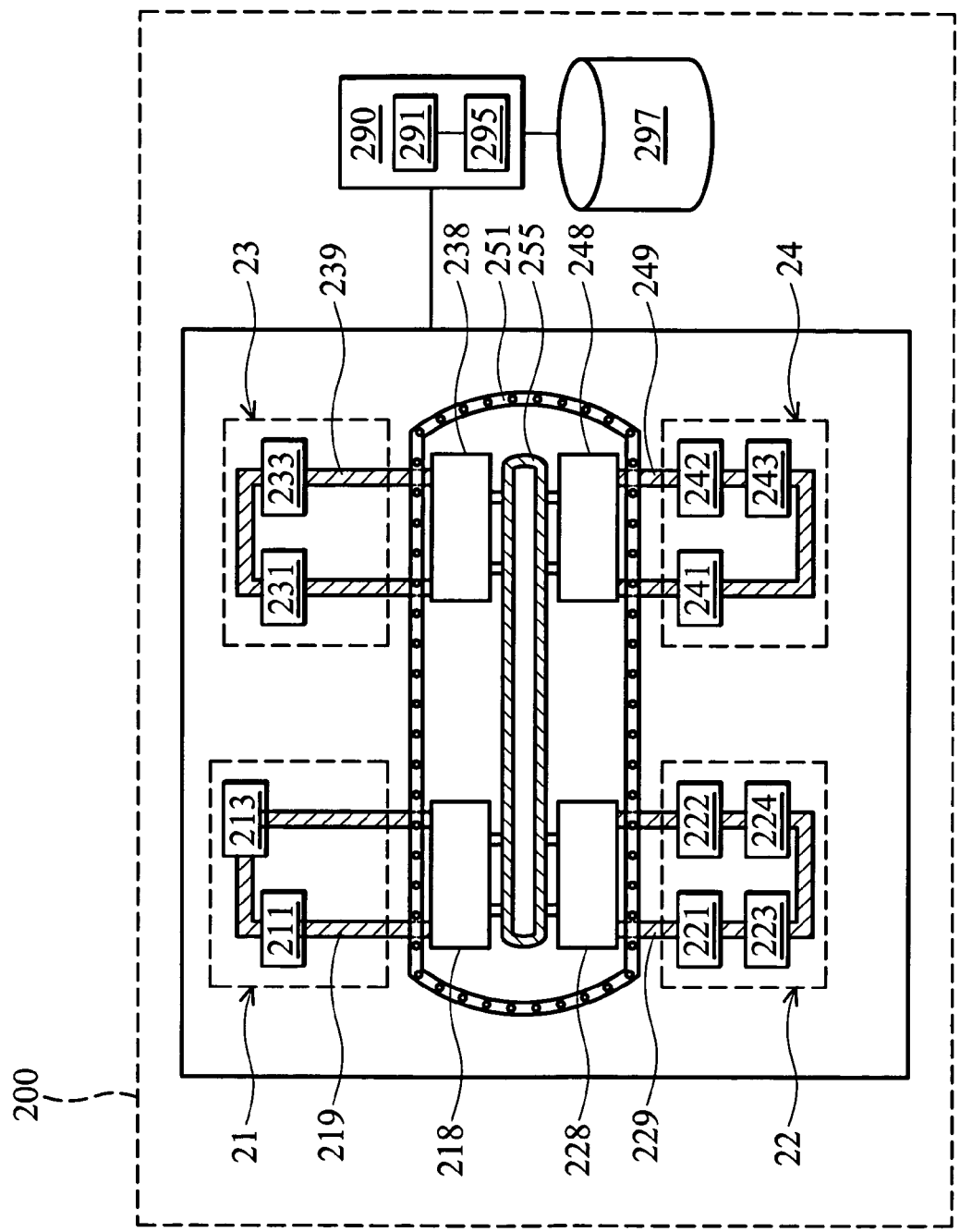
FIG. 2 is a schematic view of an embodiment of a fabrication system according to the present invention.

FIG. 2 is a schematic view of an embodiment of a fabrication system according to the present invention. Specifically, a fabrication system 200 is a semiconductor fabrication system comprising tool bays 21, 22, 23, 24, a transport system, stockers 218, 228, 238 and 248, and a transport controller 290.

Each tool bay comprises a plurality of processing tools. Generally, each of the tool bays comprises a number of processing tools for performing various wafer fabrication functions. The tool bay 21, for example, comprises processing tools 211 and 213 capable of a photolithography function. The tool bay 22 comprises processing tools 221~224 capable of an etching function. The tool bay 23, for example, comprises processing tools 231 and 233 capable of a furnace function. The tool bay 24 comprises processing tools 241~243 capable of a polishing function. Wafers to be processed are carried by vehicles circulating in the transport system.

As illustrated in FIG. 2, the transport system comprises intrabay components 219, 229, 239, and 249, and interbay components 251 and 255. The intrabay components 219, 229, 239, and 249 are dedicated to transporting vehicles within tool bays 21, 22, 23, and 24, respectively. As illustrated in FIG. 2, the interbay components 251 and 255 transport the vehicles between different tool bays. The intrabay transport components 219, 229, 239, and 249 are connected to the interbay transport component 251, implementing overhead hoist transport (OHT) vehicles. The interbay transport component 255, implementing overhead shuttle (OHS) vehicles, is separated from the OHT-implemented components.

The stockers 218, 228, 238 and 248 temporarily stores wafer lots between processing steps. Stockers 218, 228, 238 and 248 are located between the interbay component 255 and intrabay components 219, 229, 239, and 249, respectively. Stockers 218, 228, 238 and 248 store wafers between processing and transfer these wafers between the interbay component 255 and the intrabay components 219, 229, 239, and 249, respectively.

The interbay components 251 and 255 transport the vehicles between the tool bays. The intrabay components 219, 229, 239, and 249, each connected to the interbay component 251 directly, transport the vehicles within one particular tool bay without interface transferring. The intrabay components 219, 229, 239, and 249 are connected to the interbay component 251 directly, but are separated from the interbay component 255.

For example, when a wafer lot has been processed by tool 211, moved out from tool 211, and sent to next processing tool 221, either interbay component 251 or 255 can be used. If the processing tool 221 is available when the wafer lot is moved out from the tool 211, the wafer lot can be transferred from tool 211 to 221 directly, without involving a stocker. In this situation, the OHT interbay component 251 can be selected for the tool-to-tool transport. The tool-to-tool transport, however, can only use the OHS interbay component 255 under certain situations. For example, when a traffic jam occurs in the OHT interbay component 251, or when the tool bay 21 is far from the tool bay 22, the OHS interbay component 255 can be selected.

The transport controller 290 controls operation of the transport system, comprising a route controller 291 and a loading controller 295. The route controller 291 estimates a transport cost for transporting the vehicle via the interbay component 255, and determines whether the vehicle is transported via the interbay component 251 or 255 according to the estimated transport cost.

Because all of the intrabay components 219, 229, 239 and 249 are connected to the OHT interbay component 251, OHT vehicles circulating therein are not dedicated to a particular intrabay component. The number of vehicles circulating within one intrabay component impacts transport efficiency. When the number of vehicles circulating within one intrabay component is insufficient, transport efficiency of wafer lots may decrease. Hence, a minimum number of vehicles within a particular intrabay component is predetermined. Additionally, vehicle distribution is controlled in order to maintain number of the vehicles each intrabay component above the minimum number. The loading controller 295 detects whether the number of vehicles of any of the intrabay components is lower than the preset minimum number. When the number of vehicles of one of the intrabay components, for example, intrabay component 219 is insufficient, i.e., less than the minimum number, the distribution controller 295 estimates transport costs for transporting at least one vehicle from the intrabay component 229, 239, and 249 to the intrabay component 219, respectively. The intrabay component corresponding to the lowest transport cost is then selected for supplying vehicle(s) to the intrabay component 219 the estimated transport cost is determined according to historical records of actual transport cost corresponding to each intrabay component. The historical records used in the process performed by the routing and distribution controllers may be stored in database 297.

Figure 3:
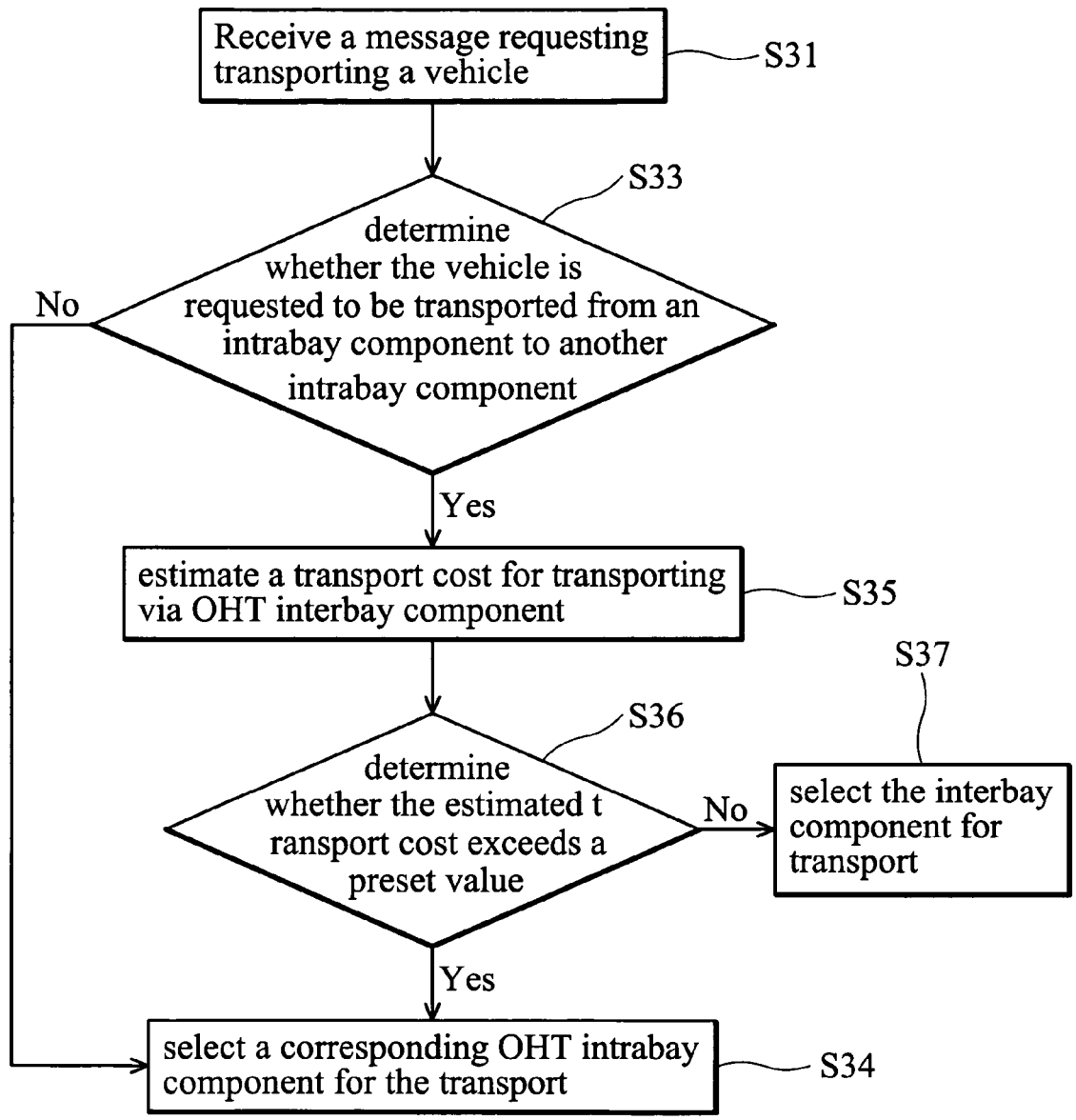
FIG. 3 is a flowchart of an embodiment of a routing method implemented in the system of FIG. 2.

FIG. 3 is a flowchart of an embodiment of a routing method of the invention. The routing method showed in FIG. 3 determines the transport path of vehicles in the described transport system.

First, a message is received, requesting transporting a vehicle (step S31). The message can be sent from a material control server (MCS). The vehicle may be loaded with work-in-process, such as wafers.

It is then determined whether the vehicle is requested to be transported from an intrabay component to another intrabay component, i.e., from a tool bay to another tool bay. (step S33) If the vehicle is requested to be transported from a tool to another tool within the same tool bay, a corresponding OHT intrabay component is selected for the transport (step S34). If the vehicle is requested to be transported from a tool to another tool belonging to another tool bay, the method proceeds to step S35. In step S35, a transport cost is estimated for transporting the vehicle via the OHT interbay component 251. The transport cost is estimated by calculating estimated transfer time and vehicle load. The estimated transfer time is determined by calculating an expectation according to historical records of interbay transport time within the fabrication system. The estimated vehicle loading is determined by calculating an expectation according to historical records of move counts of each vehicle within the tool bay.

It is then determined whether the estimated transport cost exceeds a preset value (step S36), and if so, the method proceeds to step S37, otherwise, the method proceeds to step S34. In step S37, the interbay component 251 is selected to transport the vehicle.

For example, according to the received message, a vehicle loaded with wafers is to be transported from tool 211 to 231. Tools 211 and 231 are located in different tool bays, thus a transport cost is estimated. The transport cost can be determined according to the following equation:

$$\text{transport cost} = \alpha * E_t + (1-\alpha) E_v$$

In the described equation, $E_t$ is an expected transfer time for moving the vehicle from tool 211 to tool 231. The expected transfer time is determined using known statistical methods according historical records of vehicle transfer time. The $E_v$ estimates impact for operation of tool bay 21 and intrabay component 219 rising from transporting a vehicle from intrabay component 219 to intrabay component 239. The $E_v$ can be an expected job counts for each vehicle within the intrabay component 219. Parameter $\alpha$ is a positive number between 0 and 1, representing a weighting factor assigned to the estimated transfer time.

Figure 4A:
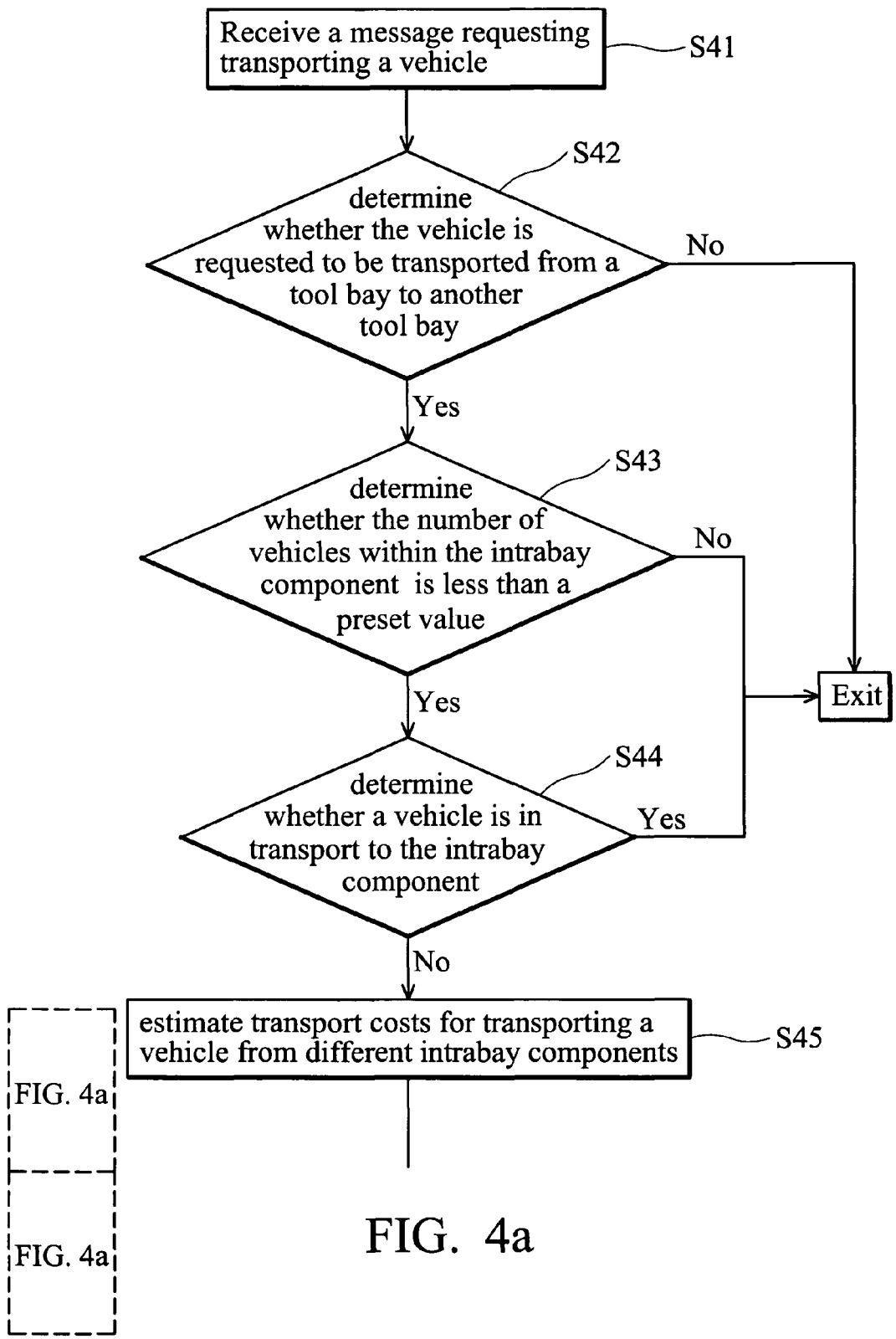
FIGS. 4a and 4b illustrate a flowchart of an embodiment of a method for controlling vehicle distribution implemented in the system of FIG. 2.
Figure 4B:
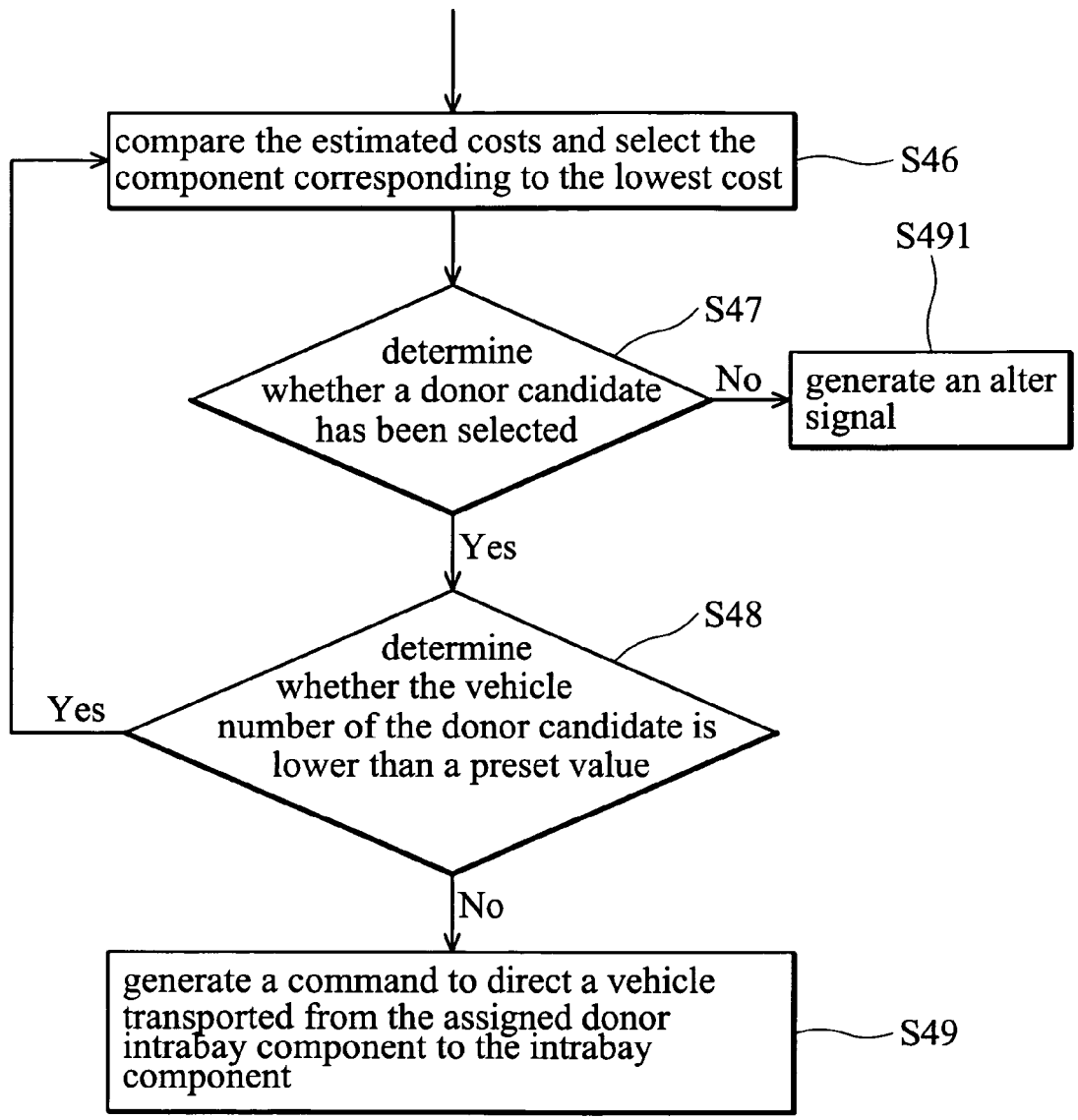

FIGS. 4a and 4b illustrate a flowchart of an embodiment of a method for controlling vehicle distribution implemented in the system of FIG. 2. The method showed in FIGS. 4a and 4b determines vehicle distribution among intrabay components in the described transport system.

First, a message is received, requesting transport of a vehicle (step S41). The message can be sent from a material control server (MCS). The vehicle may be loaded with work-in-process, such as wafers.

It is then determined whether the vehicle is requested to be transported from a tool bay to another tool bay (step S42). If the vehicle is requested to be transported from a tool to another tool within the same tool bay, the method ends, otherwise, the method proceeds to step S43.

In step S43, it is determined whether the number of vehicles within the intrabay component 219 is less than a preset value. The preset value can be determined according to operation and configuration of the tool bay 21, for example, throughput of tool bay 21.

In step S44, it is determined whether a vehicle is in transport to the intrabay component 219, and if so, the method ends, otherwise, the method proceeds to step S45.

In step S45, transport costs are estimated for transporting a vehicle from intrabay components 229, 239, and 249, respectively. The transport cost is estimated by calculating estimated transfer time and vehicle load. The estimated transfer time is determined by calculating an expected transport time according to historical records of interbay transport time within the fabrication system. The estimated vehicle loading is determined by calculating an expectation according to historical records of move counts of each vehicle within the tool bay.

For example, according to the received message, a vehicle loaded with wafers is moved out of tool bay 21, and no other vehicle is transported to tool bay 21. Additionally, the number of vehicles is lower than a preset value, and an additional vehicle is required from an intrabay component 229, 239, or 249. The costs corresponding to supplying a vehicle to intrabay component 219 from intrabay components 229, 239, and 249 are estimated, respectively. The transport cost can be determined according to the following equation:

$$\text{transport cost} = \beta * E_t + (1-\beta) E_v$$

In the described equation, $E_t$ is an expected transfer time for moving a vehicle from a donor tool bay to a receiver tool bay. The expected transfer time is determined using known statistical method according to historical records of vehicle transfer time. The $E_v$ is used for estimating impact for operation of a donor tool bay and corresponding intrabay component arising from transporting a vehicle from the donor intrabay component to a receiver intrabay component. The $E_v$ can be an expected job count for each vehicle within the donor intrabay component. Parameter $\beta$ is a positive number between 0 and 1, representing a weighting factor assigned to the estimated transfer time.

In step S46, the estimated costs corresponding to intrabay components 229, 239, and 249 are compared, and the one with the lowest cost to transfer one vehicle thereof to the intrabay component 219 is selected. In step S47, it is determined whether a donor candidate has been selected, and if so, the method proceeds to step S48, otherwise, the method proceeds to step S491. In step S491, an alter signal is generated, directing selection of a donor candidate. In step S48, it is determined whether the vehicle number of the donor candidate is lower than a preset value, and if so, the method returns to step S46 to choose another donor candidate, otherwise, the method proceeds to step S49. In step S49, a command is generated to direct a vehicle transported from the assigned donor intrabay component to the intrabay component 291.

While the invention has been described by way of example and in terms of several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for controlling vehicle distribution among a first, second, and third intrabay components within a transport system, comprising:
   determining whether the number of vehicles within the first intrabay component is insufficient based on a preset rule;
   when the number of vehicles within the first intrabay components is insufficient, estimating costs of transporting vehicles from the second and third intrabay components to the first intrabay component, wherein the transport cost is estimated by calculating estimated transfer time and vehicle load;
   comparing the estimated costs corresponding to the second and third intrabay components, and selecting the vehicle with the lower cost for transfer to the first intrabay components.

2. The method of claim 1, further estimating the transfer time by calculating an expectation according to historical records of interbay transport time within the fabrication system.

3. The method of claim 1, further estimating the vehicle loading by calculating an expectation according to historical records of move counts of each vehicle within the tool bay.

* * * * *